United States Patent
Chikara

(10) Patent No.: US 9,119,321 B2
(45) Date of Patent: Aug. 25, 2015

(54) ASSEMBLY METHOD FOR CONVERTING THE PRECURSORS TO CAPACITORS

(75) Inventor: Azuma Chikara, Ibaraki (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 624 days.

(21) Appl. No.: 13/305,196

(22) Filed: Nov. 28, 2011

(65) Prior Publication Data

US 2012/0079717 A1    Apr. 5, 2012

Related U.S. Application Data

(62) Division of application No. 12/132,316, filed on Jun. 3, 2008, now abandoned.

(51) Int. Cl.
| H01G 7/00 | (2006.01) |
| H05K 1/18 | (2006.01) |
| H01G 2/06 | (2006.01) |
| H01G 4/06 | (2006.01) |
| H01G 4/30 | (2006.01) |

(Continued)

(52) U.S. Cl.
CPC .............. *H05K 1/185* (2013.01); *H01G 2/065* (2013.01); *H01G 4/06* (2013.01); *H01G 4/30* (2013.01); *H01L 23/49822* (2013.01); *H01L 23/50* (2013.01); *H01L 24/73* (2013.01); *H05K 1/0231* (2013.01); *H05K 1/162* (2013.01); H01L 24/16 (2013.01); H01L 24/48 (2013.01); H01L 2224/16145 (2013.01); H01L 2224/16225 (2013.01); H01L 2224/32014 (2013.01); H01L 2224/32225 (2013.01); H01L 2224/48091 (2013.01); H01L 2224/48145 (2013.01); H01L 2224/48227 (2013.01); H01L 2224/73265 (2013.01); H01L 2924/01019 (2013.01); H01L 2924/01029 (2013.01); H01L 2924/10253 (2013.01); H01L 2924/14 (2013.01); H01L 2924/15311 (2013.01); H01L 2924/19041 (2013.01); H01L 2924/19042 (2013.01); H01L 2924/19043 (2013.01); H01L 2924/19106 (2013.01); H01L 2924/30105 (2013.01); H05K 1/181 (2013.01); H05K 3/429 (2013.01); H05K 3/4602 (2013.01); H05K 3/4688 (2013.01); H05K 2201/0187 (2013.01); H05K 2201/10643 (2013.01); H05K 2201/10674 (2013.01); Y10T 29/4913 (2015.01)

(58) Field of Classification Search
CPC .......... H01G 2/065; H01G 4/30; H01G 4/06; H01L 23/49822; H01L 23/50; H05K 1/0231; H05K 1/162; H05K 1/185
USPC .......... 29/25.41–25.42, 592.1, 830, 846, 832; 361/760, 763; 257/723, 678, 916
See application file for complete search history.

(56) References Cited

U.S. PATENT DOCUMENTS

| 6,346,743 | B1 * | 2/2002 | Figueroa et al. ............... 257/723 |
| 6,794,273 | B2 * | 9/2004 | Saito et al. .................... 438/462 |

(Continued)

*Primary Examiner* — Minh Trinh
(74) *Attorney, Agent, or Firm* — Steven A. Shaw; Frank D. Cimino

(57) ABSTRACT

A method of assembling a packaged semiconductor device includes dropping a pre-formed capacitor precursor and an integrated circuit on a surface of a substrate. A pair of vias are formed in the pre-formed capacitor precursor if they don't already exist. The vias are filled with an electrically conductive material to form a chip capacitor. The filling of the vias provides an electrical contact between capacitor plates of the chip capacitor and electrically conductive contact regions on the substrate.

4 Claims, 8 Drawing Sheets

(51) Int. Cl.
*H01L 23/498* (2006.01)
*H01L 23/50* (2006.01)
*H05K 1/02* (2006.01)
*H05K 1/16* (2006.01)
*H01L 23/00* (2006.01)
*H05K 3/42* (2006.01)
*H05K 3/46* (2006.01)

(56) References Cited

U.S. PATENT DOCUMENTS 7,889,509 B2 * 2/2011 Urashima et al. ............. 361/760
8,183,465 B2 * 5/2012 Suzuki et al. ................. 174/260
2008/0239685 A1 * 10/2008 Kawabe et al. ............... 361/782

* cited by examiner

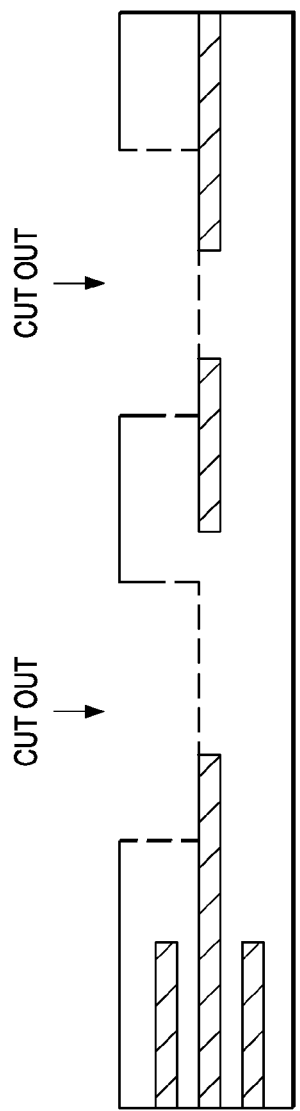
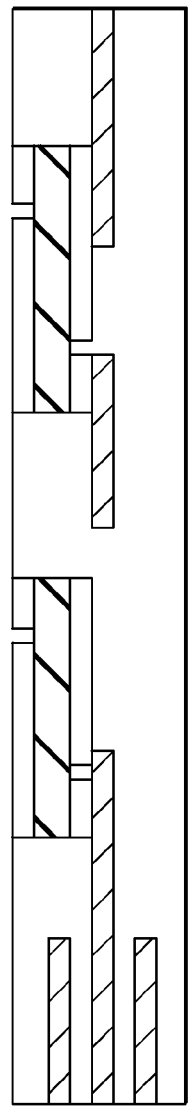
FIG. 7A
FIG. 7B
DROP THE DICED CAPs

ASSEMBLY METHOD FOR CONVERTING THE PRECURSORS TO CAPACITORS

CROSS-REFERENCE TO RELATED APPLICATION

This application is a Divisional of and claims priority to U.S. patent application Ser. No. 12/132,316 filed on Jun. 3, 2008 now abandoned. Said application incorporated herein by reference for all purposes.

FIELD

Embodiments of the invention are related to integrated circuits (ICs), and particularly to chip capacitors and packaged semiconductors having one or more chip capacitors therein.

BACKGROUND

Packaged semiconductors can be embodied as single die packages or multi-chip packages. On example of single chip packages is a chip scale package (CSP).

Multichip packages include multichip modules (MCM) and System-in-a-Package or System in Package (SIP). As commonly used and defined herein, a plurality of die mounted on the same plane (e.g. the cavity substrate) is referred to as a MCM, whereas vertically stacked die stacking is referred to as a SIP.

The MCM or SIP performs all or most of the functions of an electronic system, such as the functions required by a cellular phone or music player. An exemplary SIP generally comprises several chips, such as a specialized processor, dynamic random access memory (DRAM), flash memory, and passive components, such as resistors, capacitors and in some case inductors, all mounted on the same substrate (e.g. a multi-layer printed circuit board (PCB)). This means that a complete functional unit can be built in a single multi-chip package, so that few external components are needed for system operation.

In certain applications, packaged semiconductors need high value capacitors, such as for power supply decoupling to minimize switching noise in certain electronic systems. To realize such high value capacitors, conventionally, an embedded capacitor is used. Conventional embedded capacitors are realized using a stack up structure comprising a plurality of stacked metal layers having dielectric layers therebetween and via connections between the metal layers formed on a conventional multi-layer PCB substrate, such as FR4 or BT.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

Conventional embedded stack up structure capacitors require an interconnect be formed between the metal stack up layers for each capacitor plate, and thus require a plurality of interconnect steps. In addition, a step is needed to electrically connect the stack up capacitor(s) to an electrically conducting (e.g. copper) layer on the PCB substrate (e.g. FR4). Therefore, the process to form conventional stack up structure capacitors involves a large number of processing steps. Moreover, the dielectric between the metal layers is generally the dielectric substrate material (e.g. FR4) which is known to have a relatively low dielectric constant, thus requiring a wide metal area to achieve reasonable capacitance values.

Embodiments of the present invention substantially solve the problems of incorporating discrete capacitors in the packaged semiconductor device by dropping a pre-formed capacitor precursor, which as defined herein is a multilevel metal structure having dielectric between the respective electrically conductive (e.g. metal) layers, but lacks electrical connection between the electrically conductive layers, onto a PCB substrate surface during assembly. The substrate surface can be a top or bottom surface of a multi-layer PCB, or embedded within one of the layers the multi-layer PCB.

The dielectric layers can be high k dielectric layers which helps limit the necessary area to realize a desired capacitance value. Alternatively, the dielectric layers can have a relatively low k value, but can provide high dielectric strength. After dropping one or more pre-formed capacitor precursors according to embodiments of the invention onto or into the substrate, the metal layers of respective plates of the pre-formed capacitor precursor are electrically connected by standard printed circuit board manufacturing comprising forming vias (e.g. by drilling holes) and filing the vias with an electrically conductive material (e.g. copper). The filled vias also serve the purpose of electrically connecting the capacitor plates to electrically conductive contact regions on the substrate material, and can be drilled and filled along with other vias on the PCB.

DESCRIPTION OF THE DRAWINGS

FIG. 7A-E provide steps with respective cross sectional views for an exemplary method according to an embodiment of the invention for assembling a packaged semiconductor having embedded capacitors.

DETAILED DESCRIPTION

Figure 1A:
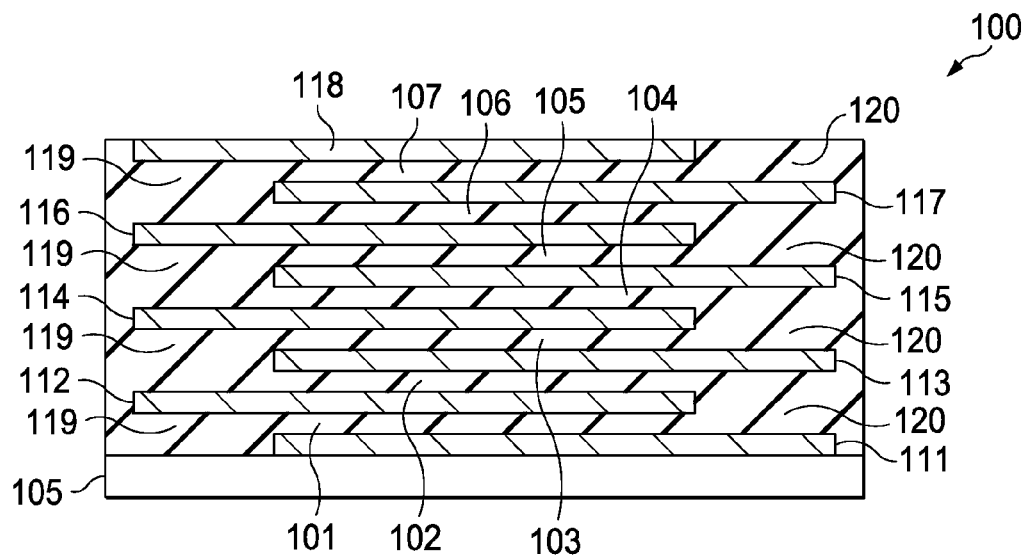
FIG. 1A is a cross sectional depiction of a chip capacitive precursor according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As defined herein, a chip capacitor is a multilayer monolithic capacitor constructed in chip form, with metallized terminations for each plate of the capacitor to facilitate direct bonding on hybrid integrated circuits, such as those built on PCB substrates. As described above, one or more preformed chip capacitor precursors are first fabricated. Precursors become completed capacitors during assembly by placing/dropping the capacitive precursor on a PCB substrate surface or on a internal layer of a multi-layer PCB laminate substrate using conventional assembly processing including drilling vias and filling the vias with an electrically conductive material (e.g. copper). To avoid confusion, as used herein, the process to form the capacitive precursor is referred to as fabrication, while the processing to convert the capacitor precursor to the chip capacitor after dropping onto the board substrate is referred to herein as part of assembly processing.

In one embodiment of the invention, the substrate for the precursor capacitor can be a PCB substrate, such as FR4 or BT, or a ceramic substrate, wherein one or more preformed chip capacitor precursors are generally preformed using a fabrication process comprising conventional PCB manufacturing techniques. The capacitor precursor fabricated becomes a chip capacitor during assembly by dropping the precursor into or onto a board and electrically connecting the electrically conducting (e.g. metal) layers together associated with each of the respective capacitor plates. In one embodiment, the capacitor precursor becomes a chip capacitor in the assembly process using standard PCB manufacturing comprising forming vias (e.g. by drilling holes in the capacitor precursor) and filing the vias with an electrically conductive material (e.g. copper). The filled vias can also serve the purpose of electrically connecting the capacitor plates to electrically conductive contact regions on the board substrate, and in one embodiment are be drilled and filled along with other vias on the substrate.

In another embodiment of the invention, the substrate for the capacitive precursor to be fabricated can be an integrated circuit substrate (e.g. silicon wafer). In this embodiment, a plurality of chip capacitor precursors are generally simultaneously fabricated using conventional integrated circuit fabrication techniques (e.g. metal and dielectric deposition, and etching). The chip precursor fabrication process can optionally include the formation of through substrate vias (TSVs). As with the PCB substrate fabrication embodiment for the chip capacitor precursor, the fabricated integrated circuit substrate-based capacitor precursor is dropped into (in the case of embedded) or onto a board substrate surface and has its metal layers associated with respective plates of the capacitor electrically coupled by filing the vias with an electrically conductive material (e.g. copper). The filled vias can also serve the purpose of electrically connecting the capacitor plates to electrically conductive contact regions on the board substrate, and can be filled along with other vias on the board substrate.

FIG. 1A is a cross sectional depiction of a chip capacitive precursor 100 according to an embodiment of the invention. Capacitive precursor 100 comprises a substrate 105, and a plurality of electrically conducting layers (e.g. metal comprising or N+ or P+ layers) 111-118 and dielectric layers 101-107 thereon including respective dielectric layers between neighboring ones of the plurality of electrically conducting (e.g. metal comprising or P+ or N+) layers 111-118 for electrical isolation therebetween. In one embodiment, the plurality of electrically conducting layers 111-118 can comprise alternating first and second patterns, such as pattern 200 shown in FIG. 2A and pattern 250 shown in FIG. 2B. Layers 112, 114, 116 and 118 provide a first pattern or first patterns which each include electrically conducting material-free areas 120 which overlay electrically conducting layers 111, 113, 115 and 117. Layers 111, 113, 115 and 117 provide a second pattern or second patterns which each include electrically conductive material-free areas 119 which overlay metal comprising areas of the first pattern in layers 112, 114, 116, and 118. Capacitive precursor 100 does not have any electrical connection between any of the electrically conducting layers 111-118.

As described below, during assembly, further processing is performed on capacitive precursor 100, including at least via filling. After dropping the capacitive precursor 100 on a surface of or to be embedded within a layer of a multilayer PCB (e.g. FR4), a first via is formed in area 119 and a second via is formed in area 120, wherein the vias are generally filled in assembly with a metal comprising material (e.g. plated with copper) to complete the chip capacitor. In the completed chip capacitor, filled vias formed in areas 119 and 120 are used to electrically connect together layers 112, 114, 116, and 118 and 111, 113, 115 and 117, which serves as a first capacitor plate and a second capacitor plate, respectively.

As noted above, in one embodiment, substrate 105 can be a multi-layer PCB substrate, such as polymer-based FR4 or BT, or a ceramic-based substrate. In this embodiment, the chip capacitor precursor 100 is generally fabricated using a stack up structure having a dielectric adhesive material placed between the respective PCB layers, using conventional PCB manufacturing techniques (e.g. drilling, filling). In another embodiment, substrate 105 is a conventional integrated circuit substrate (e.g. silicon wafer), wherein the chip capacitor or chip capacitors is/are generally fabricated using conventional integrated circuit fabrication techniques (e.g. deposition of dielectric and metal and etching (e.g. plasma etching or RIE).

Figure 1B:
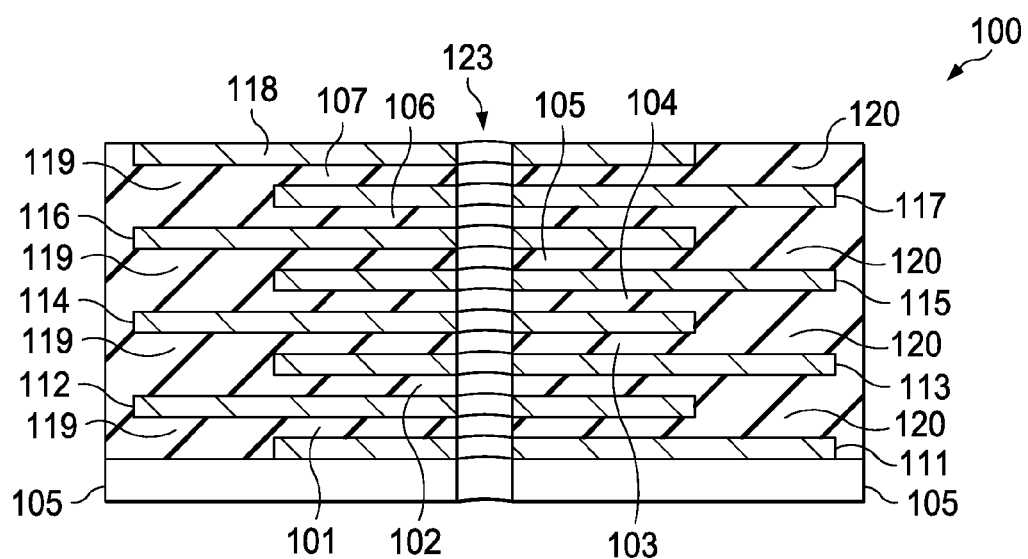
FIG. 1B is a cross sectional depiction of a chip capacitive precursor according to another embodiment of the invention further comprising a feed through adapted structure for routing electrical connections through the capacitive precursor and the capacitor formed therefrom.

The dielectric layers 101-107 can comprise a variety of dielectric materials. In certain embodiments, such as for certain embodiments of the laminate embodiment for the capacitive precursor, the dielectric material is that of the PCB board, such as FR4 or BT (k of about 4.2 to 4.8). In another embodiment, the dielectric layer comprises a material having a k≥50, such as BNZ (Bi—Nb—Zn) which provides a k value of about 170-220. In yet another embodiment, the dielectric material is a high dielectric strength material, particularly for high voltage applications. FIG. 1B is a cross sectional depiction of a chip capacitive precursor 150 according to an embodiment of the invention further comprising a feed through adapted structure 123 for routing electrical connections (e.g. pin routing) through the capacitive precursor and the capacitor formed therefrom. For example, the electrically conductive material free common area defined by structure 123 can be used for a pin routing interconnect that goes through the capacitor structure, but is otherwise unrelated to the capacitive precursor or later completed capacitive structure. The area of the structure 123 should generally be in the range of from 0.05 to 0.5 mm, such as 0.1 to 0.3 mm and the region around the drilled region designed to allow clearance and tolerancing for drill processing. The region around the drilled region generally includes a larger diameter via landing area (e.g. 2 times the drill diameter).

Figure 2A:
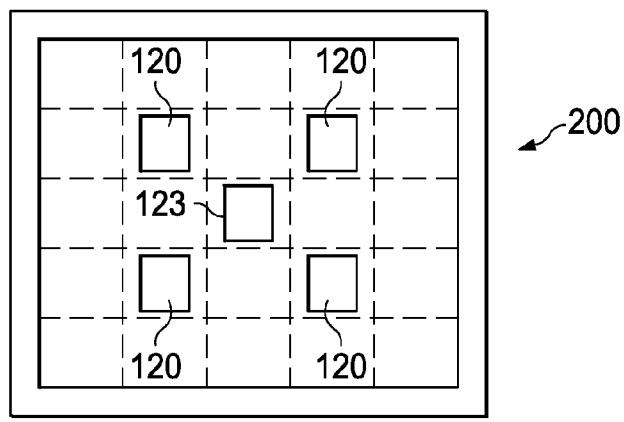
FIGS. 2A and B show exemplary designs for odd electrically conductive layers, such as the odd numbered layers shown in FIGS. 1A and B, and an exemplary design for even layers shown in FIGS. 1A and B, according to another embodiment of the invention.
Figure 2B:
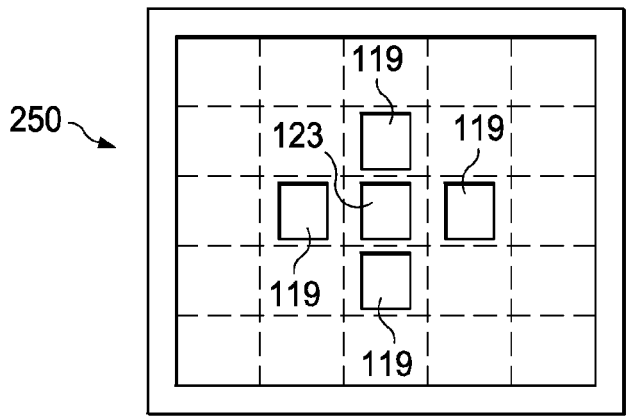

FIGS. 2A and 2B show exemplary designs 200 and 250, respectively, for odd electrically conducting layers, such as layers 111, 113, 115 and 117, and even layers, such as layers 112, 114, 116 and 118. Layers 111, 113, 115 and 117 which will form one plate of the chip capacitor (after assembly) can use the pattern (e.g. metal pattern) shown in FIG. 2A, using any one (or more than one) of the electrically conductive material free areas 120. Similarly, layers 112, 114, 116 and 118 which will form the other plate of the chip capacitor (after assembly) can use the pattern (e.g. metal pattern) shown in FIG. 2B, using any one (or more than one) of the electrically conductive material free areas 119. For the stack up embodiment, the area of the electrically conductive material free areas 119 and 120 are generally large enough to accommodate drill holes within. The exemplary designs shown in FIGS. 2A and 2B include optional feed through adapted structure 123 for routing electrical connections through the capacitive precursor and the capacitor formed therefrom.

In one embodiment, the electrically conductive material (e.g. metal) patterns, and the locations of electrically conductive material free areas 119 and 120 and optionally electrically conductive material free area 123 can be designed to match an intended metal interconnect pattern on the board substrate the capacitive precursor will be dropped onto. As described below relative to FIG. 3B, the capacitive precursor can comprise a plurality of capacitive precursors on a common substrate 350. In this embodiment, the location of the electrically conductive material free areas 119 and 120 and optionally electrically conductive material-free area 123 for each capacitor precursor can be designed to match an intended metal interconnect pattern on the board substrate, in which each of the capacitive precursors will be dropped onto.

Figure 3A:
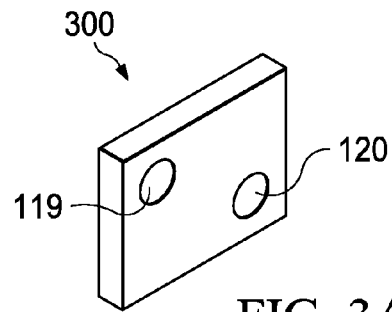
FIG. 3A shows a depiction of a single capacitor precursor showing electrically conductive material free areas for accommodating drill holes or vias within for completing the chip capacitor during assembly processing.
Figure 3B:
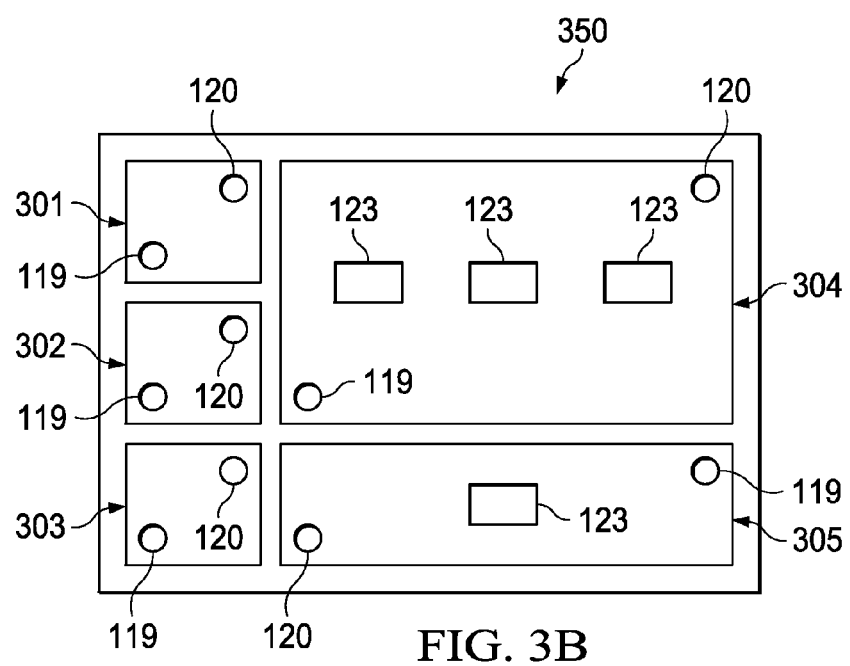
FIG. 3B shows a depiction of a plurality of capacitive precursors on a common substrate that can be provided after dicing a larger structure, or in another embodiment as an un-diced structure, according to yet an embodiment of the invention.

The fabricated capacitive precursor can be diced into structures comprising single capacitor precursors, diced into structures comprising a plurality of capacitive precursors, or a combination of single capacitor precursors and a plurality of capacitive precursors. FIG. 3A shows a depiction of a single capacitor precursor 300 showing electrically conductive material-free areas 119 and 120 for accommodating drill holes within. Typically, following fabrication, a plurality of single capacitor precursors 300 are generated by dicing. FIG. 3B shows a depiction of a plurality of capacitive precursors on a common substrate 350 that can be provided after dicing a larger structure (e.g. including other capacitive precursors), or in another embodiment as an un-diced structure. Capacitive precursor 350 comprises five (5) capacitor precursors 301, 302 and 303, 304 and 305, each showing electrically conductive material free areas 119 and 120 for accommodating drill holes within. Capacitive precursors 304 and 305 include optional feed through adapted structure 123 for routing electrical connections through the capacitive precursor and the capacitor formed therefrom.

Figure 4:
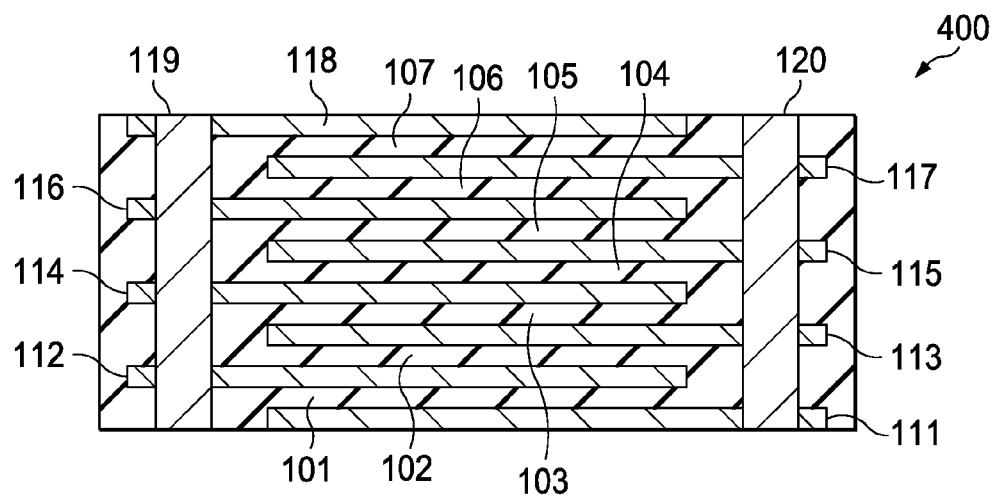
FIG. 4 is a cross sectional depiction of a capacitor precursor following drilling to form vias, according to an embodiment of the invention.

FIG. 4 is a cross sectional depiction of a capacitor precursor 400 following drilling or etching in the case of TSV processing to form vias 119 and 120. In one embodiment, a multi-layer laminate is fabricated using a substrate layer stack up process. Vias 119 and 120 are shown extending from top to bottom of capacitor precursor 400. Following dropping onto a board during assembly, the vias are generally plated with a metal (e.g. copper) which connects the respective metal layers for each plate of the chip capacitor, and the chip capacitor to an electrically conductive trace on the board substrate.

Figure 5A:
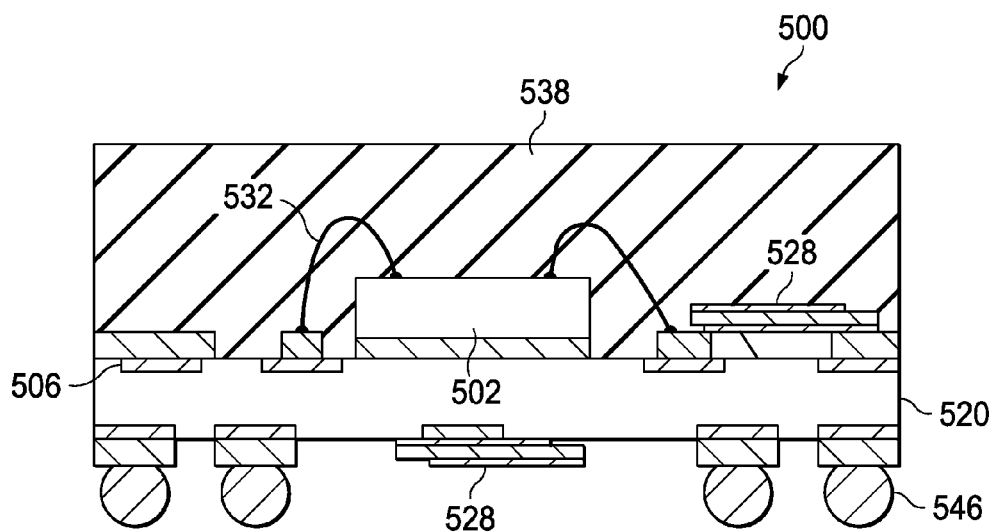
FIG. 5A is a cross sectional depiction of a chip scale package (CSP) comprising an integrated circuit die and a pair of chip capacitors, according to an embodiment of the invention.

FIG. 5A is a cross sectional depiction of a chip scale package (CSP) 500 comprising an integrated circuit die 502. CSP 500 comprises a first substrate 520, such as multi-layer laminate PCB substrate having dielectric adhesive between the respective e layers, and a first metal comprising interconnect material 506 on the top and bottom surface of first substrate 520. Vias through first substrate 520 which are present are not shown for simplicity. CSP 500 includes bond wires 532, mold compound 538, and solder balls 546. Chip capacitors according to an embodiment of the invention 528, such as formed in assembly by capacitor precursors 400 shown in FIG. 4 to form vias and filling the resulting vias with a metal (e.g. copper) are shown on the top surface and the bottom surface of the first substrate 520. As known in the art, drilling can comprise conventional mechanical drilling or laser drilling methods or the like. In one embodiment the chip capacitor 528 comprises a decoupling capacitor connected a power supply terminal for the die 502 and a ground for the die 502.

Figure 5B:
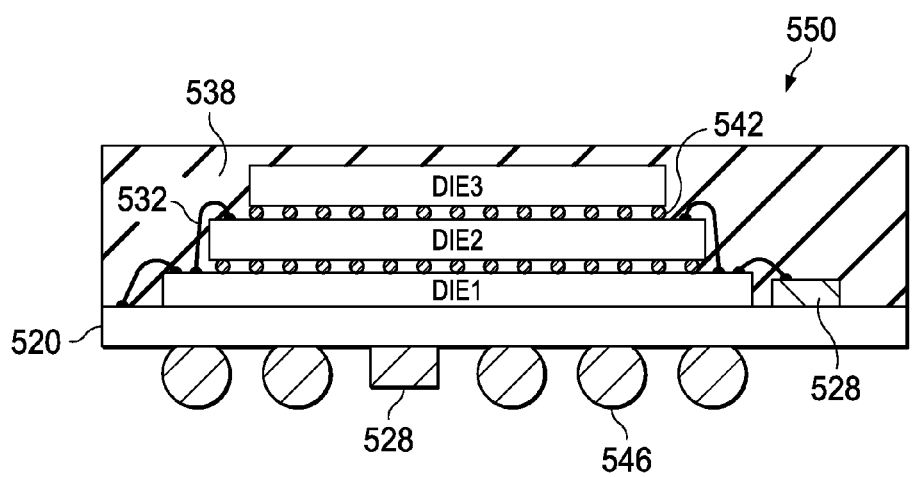
FIG. 5B is a cross sectional depiction of a system-in-package (SIP) comprising a plurality of integrated circuit die stacked on one another having a dielectric material therebetween. At least one of the integrated circuit die coupled to chip capacitors according to an embodiment of the invention is disposed on a PCB surface.

FIG. 5B is a cross sectional depiction of a system-in-package (SIP) 550 comprising a 3 die SIP configuration employing both wirebonding and flip chip bonding. SIP 550 comprises a first substrate 520, such as multi-layer PCB substrate having dielectric adhesive between the substrate layers, and a first metal comprising interconnect material (not shown) on the first substrate 520. A plurality of integrated circuit die shown as die 1, die 2 and die 3 are stacked on one another. SIP 500 includes bond wires 532, mold compound 538, flip-chip balls 542 and solder balls 546. Chip capacitors according to an embodiment of the invention 528, such as formed in assembly by drilling capacitor precursors 400 shown in FIG. 4 to form vias and filling the resulting vias with a metal (e.g. copper) are shown on the top surface and the bottom surface of the first substrate 520. In one embodiment the chip capacitor 528 comprises a decoupling capacitor connected a power supply terminal for the SIP and a ground for the SIP.

Figure 6A:
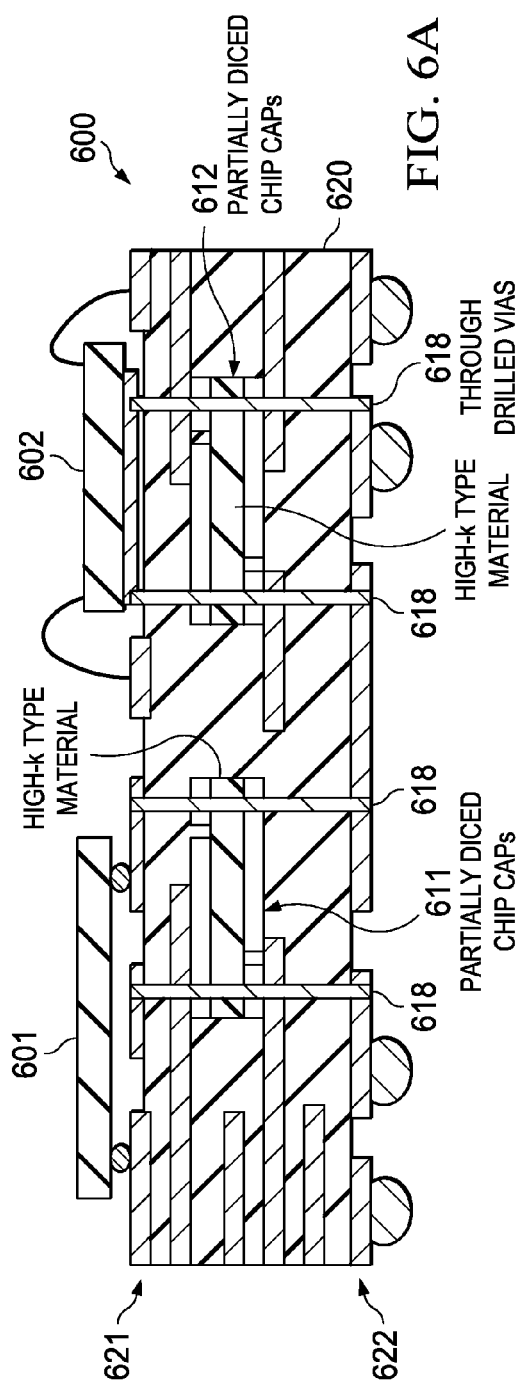
FIG. 6A is a cross sectional depiction of a multi-chip module (MCM) comprising a plurality of integrated circuit die arranged on a surface of a multi-layer PCB substrate. The integrated circuit die are each coupled to diced embedded capacitors, according to an embodiment of the invention.

FIG. 6A is a cross sectional depiction of a multi-chip module (MCM) 600 comprising a plurality of integrated circuits 601 and 602 arranged on a surface of a multi-layer PCB substrate 620. The integrated circuit die are each coupled to respective diced embedded capacitors 611 and 612 which are disposed on the second layer of the substrate 620, according to an embodiment of the invention. Since embedded capacitors are pre-fabricated as described above, embedded capacitors 611 and 612 can include a high k dielectric material. The layers of the substrate 620 can comprise a dielectric material, such as FR4. Through drilled vias 618 filled with a metal (e.g. copper) couple metal 621 on the topside of the substrate 620 to metal 622 on the bottom side of the substrate and complete the precursor capacitor to become chip capacitors. The die 601 and 602 are shown coupled to chip capacitors 611 and 612, respectively.

Figure 6B:
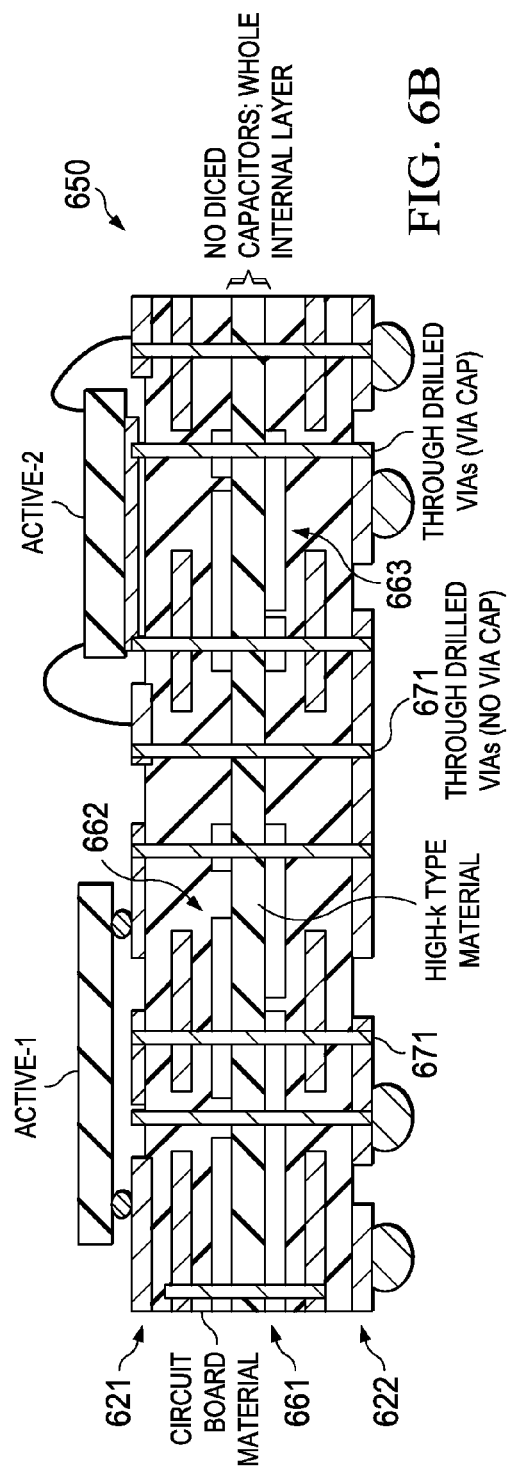
FIG. 6B is a cross sectional depiction of a multi-chip module (MCM) comprising a plurality of integrated circuits arranged on a surface of a multi-layer PCB substrate. The integrated circuit die are each coupled to embedded chip capacitors, wherein the embedded capacitors occupy an entire layer of the PCB, according to an embodiment of the invention.

FIG. 6B is a cross sectional depiction of a multi-chip module (MCM) 650 comprising a plurality of integrated circuits 651 and 652 arranged on a surface of a multi-layer PCB substrate 620. The integrated circuit die are each coupled to embedded chip capacitors according to an embodiment of the invention 661, 662, 663, wherein the embedded capacitors occupy an entire layer of the PCB, the according to an embodiment of the invention. A metal filled through drilled via 671 is shown which provides an electrical connection between the metal 621 on the top of the substrate and the metal 622 on the bottom of the substrate.

Figure 7C:
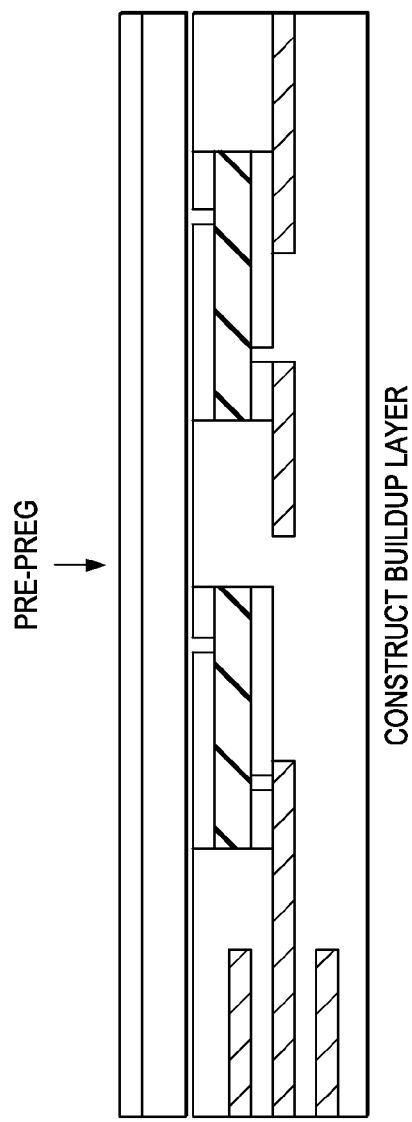
Figure 7D:
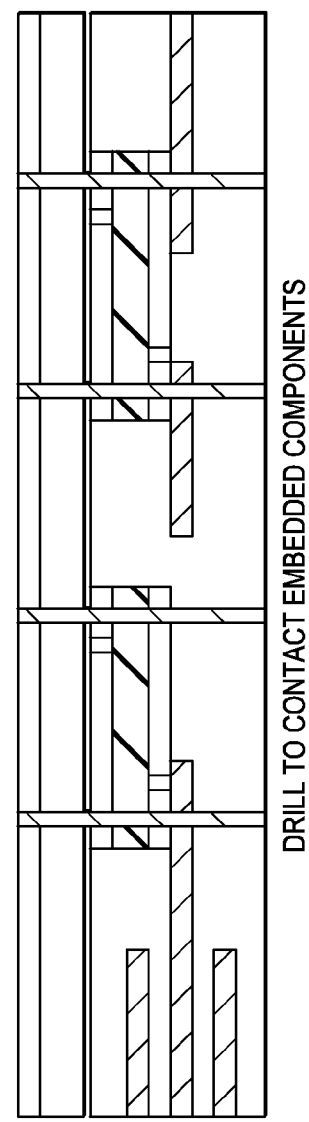
Figure 7E:
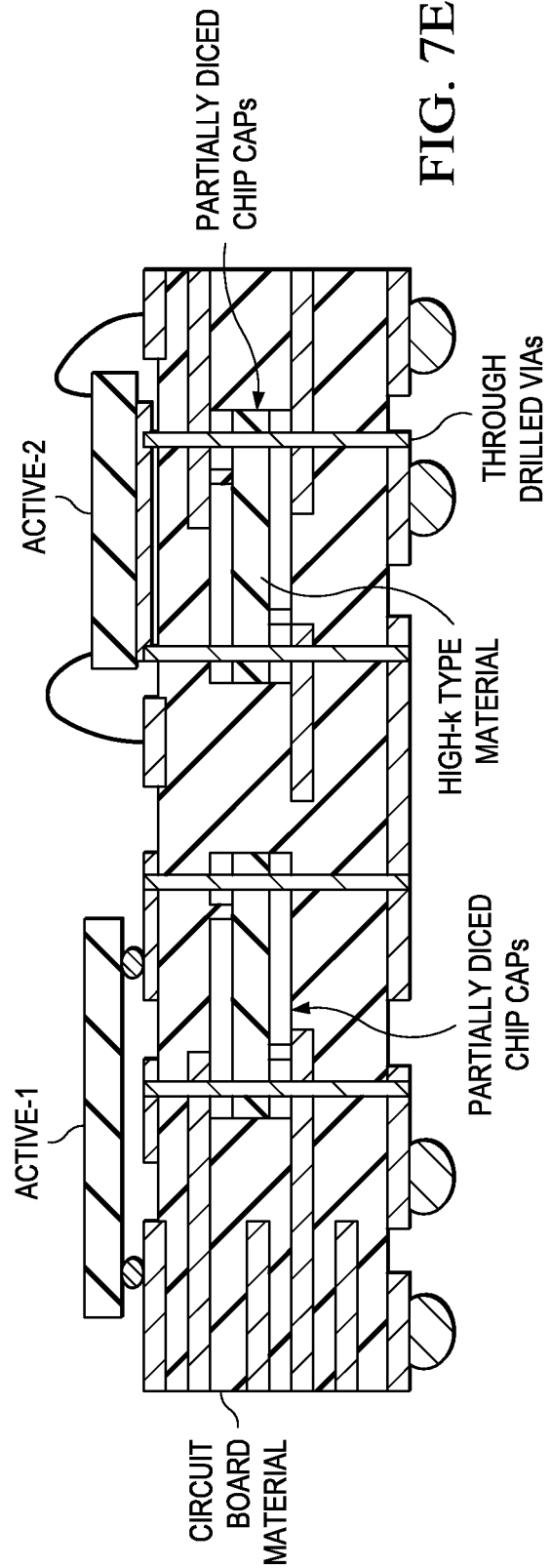

FIG. 7A-E provide steps with respective cross sectional views for an exemplary method according to an embodiment of the invention for assembling a packaged semiconductor having embedded capacitors positioned within a layer of a multi-layer PCB substrate. The exemplary packaged semiconductor is the MCM 600 shown in FIG. 6A. FIG. 7A shows a multilayer PCB substrate having cut out regions formed by removing board material in a portion of a layer of a multilayer laminate substrate. FIG. 7B shows a generally planar structure after dropping diced precursor capacitors according to an embodiment of the invention into the cut out regions. FIG. 7C shows the structure after constructing a build up layer including a surface pre-preg layer. FIG. 7D shows the resulting structure after drilling to form vias which when filled will provide electrical contact to plates of the embedded capacitor components. After FIG. 7E shows after metallization to fill the vias and form the top side metal on the substrate, dies are attached, and bond wires placed, result in the formation of MCM 600 shown in FIG. 6A.

An exemplary method of assembling a packaged semiconductor according to an embodiment of the invention having one or more chip capacitors in a top or bottom surface of a PCB substrate is now described. The packaged semiconductor comprises a PCB substrate, at least one integrated circuit on the PCB substrate, and at least one chip capacitor die having first and second capacitor plates coupled to the integrated circuit on the PCB substrate. The first substrate can be multi-layer PCB and have electrically conductive contact regions thereon, generally on its top and bottom surface. The method comprises dropping at least one pre-formed capacitor precursor die according to an embodiment of the invention and the integrated circuit die on the same or opposite sides of the PCB substrate. If the pre-formed capacitor precursor die lacks at least a first pair of vias for providing an electrical contact between capacitor plates of the chip capacitor, following dropping, at least a first pair of vias are formed in the pre-formed capacitor precursor die. The first pair of vias are then filled with an electrically conductive material (e.g. plated with copper) to form the chip capacitor, wherein the filling of the vias provides both an electrical contact between the capacitor plates of the chip capacitor and the electrically conductive contact regions on the top and generally also the bottom surface of the PCB substrate.

In one embodiment, alignment for the drill process to form the vias can be an automated "blind" process. The blind alignment process is generally needed in the case of embedded capacitors according to embodiments of the invention. Positioning data for the particular packaged semiconductor device including lateral and optionally vertical coordinates relative to some reference on the PCB (a particular corner of the board or a bushing in the board) for mechanical alignment to the via landing locations for the respective capacitive precursors is stored. Drilling can proceed to drill the via landing locations based on the stored positioning data. Drilling can be guided to the proper depth based on vertical position coordinates.

In another embodiment of the invention, the drill process to form the vias can be a "sighted" process based at least in part on observable surface features. The sighted process is generally possible when chip capacitor precursors according to embodiments of the invention are dropped on the top or bottom of the board. As with the blind process described above, drilling can be guided to the proper depth based on stored vertical position coordinates.

Depending on application, capacitive precursors according to embodiments of the invention can be standardized designs or custom designed. In the case of custom designs, given a desired capacitance value, area available, and placement on or embedded in a board, custom capacitor precursors can be designed to provide the desired capacitance value.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. A method of assembling a packaged semiconductor device comprising:

providing a substrate, at least one integrated circuit die on said substrate, and at least one chip capacitor die having a first capacitor plate and a second capacitor plate coupled to said integrated circuit die embedded within said substrate, said substrate having electrically conductive contact regions thereon dropping a pre-formed capacitor precursor within said substrate;

dropping said integrated circuit die on said substrate;

wherein pre-formed capacitor precursor lacks at least a pair of vias for providing an electrical contact between said first capacitor plate and said second capacitor plate of said at least one chip capacitor;

following said dropping said pre-formed capacitor precursor, forming at least a pair of vias in said pre-formed capacitor precursor; and filling said pair of vias with an electrically conductive material to form said chip capacitor, wherein said filling of said vias provides an electrical contact between said first capacitor plate and second capacitor plate of said chip capacitor and said electrically conductive contact reaions on said first substrate.

2. The method of claim 1, wherein said forming said vias comprises drilling.

3. The method of claim 2, wherein said drilling is guided at least in part by stored position data for said packaged semiconductor device.

4. The method of claim 2, wherein said drilling is guided at least in part by an on observable surface feature.

\* \* \* \* \*